United States Patent [19]

Hamilton, Jr. et al.

[11] Patent Number: 5,627,377
[45] Date of Patent: May 6, 1997

[54] SINGLE CARRIER-TYPE SOLID-STATE RADIATION DETECTOR DEVICE

[75] Inventors: William J. Hamilton, Jr., Ventura; David R. Rhiger, Santa Barbara, both of Calif.

[73] Assignee: Santa Barbara Research Center, Goleta, Calif.

[21] Appl. No.: 525,998

[22] Filed: Sep. 7, 1995

[51] Int. Cl.⁶ .................................................. G01T 1/24
[52] U.S. Cl. ........................... 250/370.13; 250/370.01; 250/370.09; 250/370.14
[58] Field of Search ........................ 250/370.13, 370.14, 250/370.01, 370.09; 257/428, 429

[56] References Cited

U.S. PATENT DOCUMENTS

| | | | |
|---|---|---|---|
| 3,511,722 | 5/1970 | Meuleman | 257/429 |
| 3,527,944 | 9/1970 | Kraner | 250/370.01 |
| 5,379,336 | 1/1995 | Kramer et al. | 378/98.8 |
| 5,391,882 | 2/1995 | Rhiger | 250/370.13 |

OTHER PUBLICATIONS

G. F. Knoll, "Radiation Detection and Measurement"(Second Edition), John Wiley, N.Y., 1989. pp. 149–157.
P.N. Luke, "Single-polarity charge sensing in ionization detectors using coplanar electrodes", Appl. Phys. Lett., 65(22), Nov. 28, 1994, pp. 2884–2886.

Primary Examiner—Carolyn E. Fields
Attorney, Agent, or Firm—W. C. Schubert; W. K. Denson-Low

[57] ABSTRACT

A three terminal solid-state ionizing radiation detector (10) includes a first layer (18) of a substantially intrinsic Group II–VI compound semiconductor material, such as CdZnTe. The first layer is responsive to incident ionizing radiation for generating electron-hole pairs. The detector further includes a second layer (24) of Group II–VI compound semiconductor material and a third layer (20) of Group II–VI compound semiconductor material that is interposed between first surfaces of the first layer and the second layer. The third layer functions as a grid layer. A first electrical contact (12, 17) is coupled to a second surface of the first layer, a second electrical contact (29, 30) is coupled to a second surface of the second layer, and a third electrical contact (22) is coupled to the third layer for connecting the detector to an external circuit that establishes an electric field across the detector. The electric field causes holes to drift away from the grid layer towards the first contact while electrons drift towards and through the grid layer, through the second layer, and towards the second contact for generating a detectable output signal pulse. Because of the presence of the grid layer only the electrons contribute to the output pulse. The grid layer has a conductivity type such that electrons are a minority charge carrier within the grid layer.

21 Claims, 3 Drawing Sheets

INCIDENT RADIATION

SINGLE CARRIER-TYPE SOLID-STATE RADIATION DETECTOR DEVICE

FIELD OF THE INVENTION

This invention relates generally to detectors of ionizing radiation and, in particular, relates to solid-state detectors of ionizing radiation.

BACKGROUND OF THE INVENTION

Most conventional techniques for detecting ionizing radiation (gamma rays, x-rays, and other energetic particles) with solid-state semiconductor devices rely on two-terminal devices. Reference in this regard may be had to commonly assigned U.S. Pat. No. 5,391,882, entitled "Semiconductor Gamma Ray Detector Including Compositionally Graded, Leakage Current Blocking Potential Barrier Layers and Methods of Fabricating the Detector", by David R. Rhiger, a co-inventor of the subject matter of this patent application.

In a solid-state detector the ionizing radiation produces electron-hole pairs within the semiconductor material, which then move under the influence of an electric field toward their respective contact terminals (electrons towards a positive terminal and holes towards a negative terminal). However, because holes have a mobility that is approximately 10 times less than that of electrons, they are more easily trapped before reaching the negative contact. This results in an undesirable condition known as incomplete charge collection.

In greater detail, and in all solid-state radiation detectors that are known to the inventors, the absorbed radiation produces electron-hole pairs, or charge carriers. For example, a 100 keV gamma ray, when absorbed in the Group II–VI alloy semiconductor material CdTe, produces about 22,000 electron-hole pairs through a cascade effect from a primary photo-electron. The number of generated electron-hole pairs is directly proportional to the energy of the gamma ray. The charge carriers then drift in an electric field toward their respective contacts. A signal in an external circuit, that is connected to the contacts, arises as a result of the fact that energy is given up by the applied electric field for moving the charge carriers. For example, when falling through a potential difference of 200 volts, an electron extracts 200 eV of energy from the electric field. To replace this energy in the electric field and to maintain a constant applied voltage potential, a voltage supply in the external circuit produces a current to the detector contacts. It is this current, which flows in response to the motions of charge carriers within the detector, that constitutes the signal in the external circuit. When every carrier that is generated by the gamma ray is able to move or drift the full distance from its point of generation to its respective contact, then a full output signal is produced. This is the most desirable condition of 100% charge collection efficiency. In this case, every incoming gamma ray of the same energy will result in an output signal (pulse) of the same amplitude (except for a small spread due to the statistics of the charge generation mechanism). When a number of pulses is plotted versus the pulse amplitude, a very narrow peak is displayed. When performing high resolution spectroscopy the 100% charge collection state is an important precondition for obtaining accurate and repeatable results.

A problem to be solved in order to approach the 100% charge collection state results from the fact that not all of the charge carriers can reach their respective contacts because of trapping within the semiconductor material. The trapping times, $t_e$ and $t_h$ for electrons and holes, respectively, are defined as the average time that a charge carrier survives before falling into a trap. On an energy diagram such traps are located in a gap between the conduction band and the valence band of the semiconductor material. Once trapped, the charge carrier may be subsequently released from the trap, or it may be recombined with a charge carrier of the opposite polarity. In either case the contribution that the charge carrier would have made to the signal in the external circuit is either significantly delayed or eliminated altogether.

Quantitatively, the differences between the two kinds of charge carriers can be described as follows. In a given semiconductor material the electrons and holes have the respective mobilities $\mu_e$ and $\mu_h$. Under the influence of an electric field, of strength E, their drift velocities become $$v_e = \mu_e E \text{ and } v_h = \mu_h E,$$

respectively. Due to trapping times, the drift length (L) (average distance each carrier can travel) is given, respectively, by $$L_e = v_e t_e = \mu_e t_e E, \text{ and}$$

$$L_h = v_h t_h = \mu_h t_h E.$$

When comparing the two drift lengths it should be noted that the mobility of electrons is approximately 10 times greater than that of holes, while the trapping times of electrons are two to five times greater than for holes. Thus $L_e$ is about 20 to 50 times greater than $L_h$. By example, and for the Group II–VI compound semiconductor material CdZnTe, a typical value for the $\mu_e t_e$ product is $1 \times 10^{-3}$ cm$^2$/V.

With a typical electric field strength of 1000 V/cm, it can readily be shown that $L_e = 1$ cm. Because this drift length is long compared to a typical CdZnTe gamma ray detector thickness of 0.1 cm or 0.2 cm, the electrons can be collected with very high efficiency. The holes, however, due to their significantly smaller drift length, travel a much smaller distance than the detector thickness before being trapped. The resulting incomplete collection of charge carriers in the detector leads to unpredictable errors in the output signal, and hence a broadening of the pulse height spectrum away from the ideal sharp peak.

The inventors are aware of three conventional approaches for attempting to overcome the problem of incomplete charge collection. A first approach increases the electric field strength so as to increase the average charge carrier velocity. However, increasing the electric field strength also increases the leakage current of the solid-state detector. A second approach absorbs the ionizing radiation near the negative contact, thereby reducing the distance that the holes must travel in order to be collected. It has been found, however, that this approach is not suitable when detecting higher energy radiation (e.g., gamma rays over about 20 keV). The third approach employs a non-planar shape for the semiconductor material in order to produce a larger magnitude electric field strength only in the vicinity of the negative contact. However, this latter approach involves difficult and expensive device fabrication techniques.

A conventional Frisch grid ion chamber three-terminal detector (not a solid-state detector) is illustrated schematically in FIG. 1. Reference in this regard may also be had to "Radiation Detection and Measurement", Second Edition, G. F. Knoll, John Wiley & Sons (1989), pages 149–157. A gridded ion chamber or tube 1 contains a low pressure gas between a cathode 2 and an anode 3. An intermediate grid, known as the Frisch grid 4, divides the tube 1 into two regions. Due to the use of shielding (not shown) an incident gamma ray impinges only on the region between the cathode 2 and the Frisch grid 4, where it generates free electrons and positive ions from the gas molecules. The positive ions move toward the negative potential that is applied to the cathode 2 with batteries 5a and 5b. Because the ions are collected more slowly and experience greater recombination, they would be detrimental to the signal in regards to the total output and timing. However, the electrons are attracted towards the Frisch grid 4 and pass through it, and then continue to drift towards the anode 3 which is positive with respect to the cathode. An external signal (pulse out) is obtained across $R_L$ between the anode 3 and the Frisch grid 4 and, as a result, only the electrons contribute to the output signal from this circuit. That is, a slow rise in the output pulse corresponding to the drift of the ions is eliminated, and the signal rise time corresponds to that of the significantly faster electrons. Since each electron passes through the same potential difference between the Frisch grid 4 and the anode 3, and contributes equally to the output pulse, the pulse amplitude is made independent of the position of formation of the original electron-ion pairs. In this case the pulse amplitude becomes proportional to the total number of ion pairs formed along the track of the incident particle or ionizing radiation.

As shown by the plot of signal versus time in FIG. 2, the signal appears only when the group of electrons is drifting between the grid and anode. In FIG. 2 $n_o e$ is the number of electrons, y is a distance from the Frisch grid 4 where the incident radiation is absorbed, d is the spacing between the Frisch grid 4 and the anode 3, C is the capacitance from the Frisch grid 4 to circuit ground, and v¯is the velocity of the electrons.

Reference may also be had to an article entitled "Single-polarity charge sensing in ionization detectors using coplanar electrodes", P. N. Luke, Apply. Phys. Lett. 65(22), pgs. 2884–2886, 28 Nov. 1994, which describes a multi-terminal solid-state detector that makes use of co-planar electrodes to separate charge carriers produced by the ionizing radiation. In this device interdigitated coplanar grid electrodes are applied to a surface of a CdZnTe detector, and a common electrode is applied to an opposite surface. Perceived disadvantages to this approach include a non-uniformity of the electric field, and a difficulty in applying this device geometry to the fabrication of an array (e.g., a two-dimensional array) of ionizing radiation detectors having a small pixel size. Moreover, leakage current in the entire coplanar circuit contributes to the output signal.

OBJECTS OF THE INVENTION

It is a first object of this invention to provide a solid-state detector for ionizing radiation that overcomes the problem of incomplete charge collection, and that furthermore provides the advantage of a uniform electric field.

It is a second object of this invention to provide a three terminal, gridded, solid-state detector for ionizing radiation.

It is a third object of this invention to provide a three terminal, gridded, solid-state detector wherein only leakage current from a relatively thin layer between grid and anode terminals can contribute to the output signal.

It is a further object of this invention to provide an array of three terminal, gridded, solid-state detectors for ionizing radiation, and to also provide methods for operating and fabricating such an array.

SUMMARY OF THE INVENTION

The foregoing and other problems are overcome and the objects of the invention are realized by a three terminal solid-state ionizing radiation detector that includes a first layer of a substantially intrinsic Group II–VI compound semiconductor material, such as CdZnTe. The first layer is responsive to incident ionizing radiation for generating electron-hole pairs. The detector further includes a second layer of Group II–VI compound semiconductor material and a third layer of Group II–VI compound semiconductor material that is interposed between first surfaces of the first layer and the second layer. The third layer functions as a grid layer. A first electrical contact is coupled to a second surface of the first layer, a second electrical contact is coupled to a second surface of the second layer, and a third electrical contact is coupled to the third layer for connecting the detector to an external circuit that establishes an electric field across the detector. The electric field causes holes to drift away from the grid layer towards the first contact while electrons drift towards and through the grid layer, through the second layer, and towards the second contact for generating a detectable output signal pulse. Because of the presence of the grid layer only the electrons contribute to the output pulse. The grid layer has a conductivity type such that electrons are a minority charge carrier within the grid layer. An interface between the grid layer and the first layer has an energy bandgap that functions as a barrier to holes that would otherwise pass either from or through the third grid layer and into the first layer.

In a presently preferred embodiment of this invention the grid layer is comprised of a substantially continuous layer of p-type $Hg_{(1-x)}Cd_xTe$, wherein x has a value in a range of approximately 0.5 to approximately 0.9.

In other embodiments of this invention the grid layer can be comprised of a region that contains a dopant disposed in an apertured pattern, or a region that contains an electrical conductor disposed in an apertured pattern.

It is also within the scope of this invention to provide one and two dimensional arrays of ionizing radiation detectors, each of which includes a portion of a common first layer and an individual second layer.

BRIEF DESCRIPTION OF THE DRAWINGS

The above set forth and other features of the invention are made more apparent in the ensuing Detailed Description of the Invention when read in conjunction with the attached Drawings, wherein.

DETAILED DESCRIPTION OF THE INVENTION

It is noted at the outset that the teaching of this invention is applicable in general to solid-state detectors of ionizing radiation. A presently preferred semiconductor material for fabricating the detecting layer is CdZnTe, but other compound semiconductors such as CdTe, CdTeSe, $HgI_2$, GaAs, and AlSb can also be employed. $Hg_{(1-x)}Cd_xTe$ can also be used, so long as the value of x is made large and the resulting detector operated at low temperatures. A presently preferred, but not limiting, operating temperature is above the cryogenic range, such as at room temperature, where detectors made of elemental semiconductors such as Si and Ge are not effective. However, if suitably cooled the semiconductor material of the detector can be Si or Ge, or a Si/Ge alloy.

Figure 1:
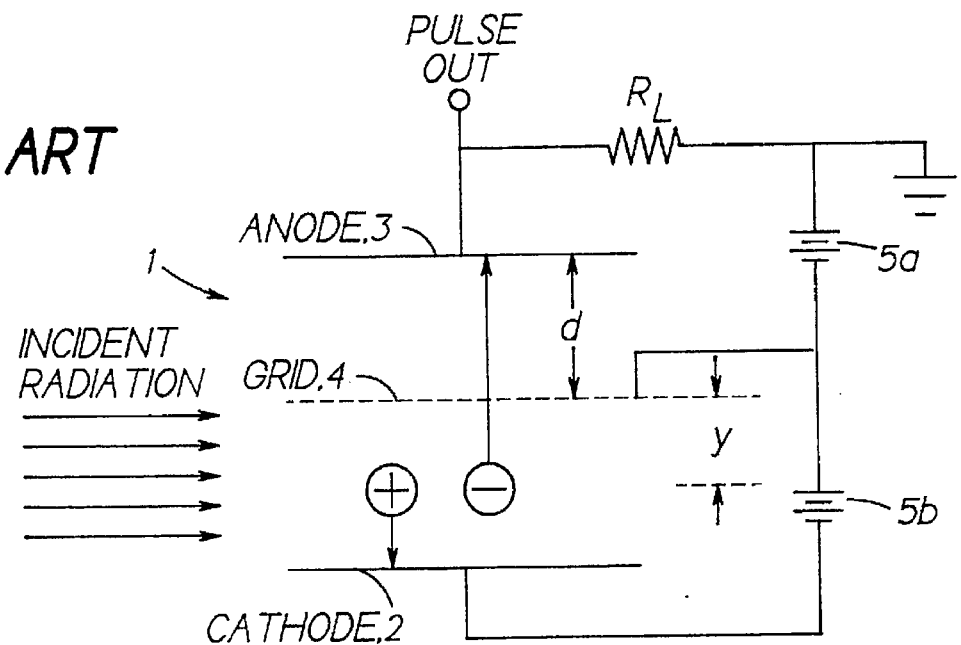
FIG. 1 is schematic diagram of a conventional ionizing radiation detector, more particularly a gridded ion chamber, that employs a low pressure gas to generate free electrons and positive ions from incident radiation, and a Frisch grid to eliminate the effect of the ions on an output signal.
Figure 2:
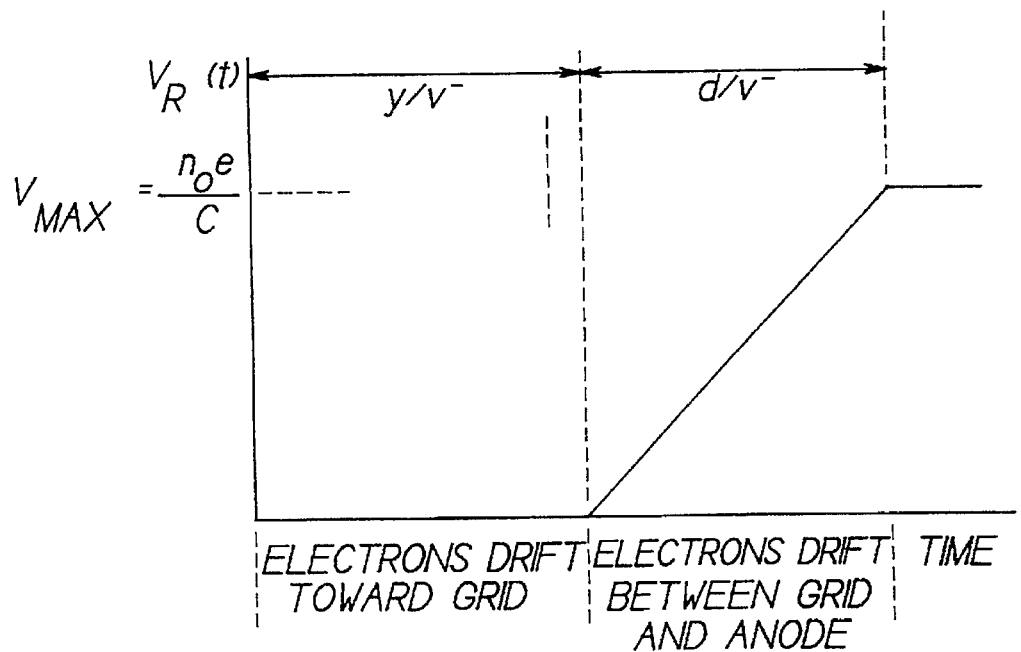
FIG. 2 is a plot of an output pulse from the gridded ion chamber of FIG. 1.
Figure 3:
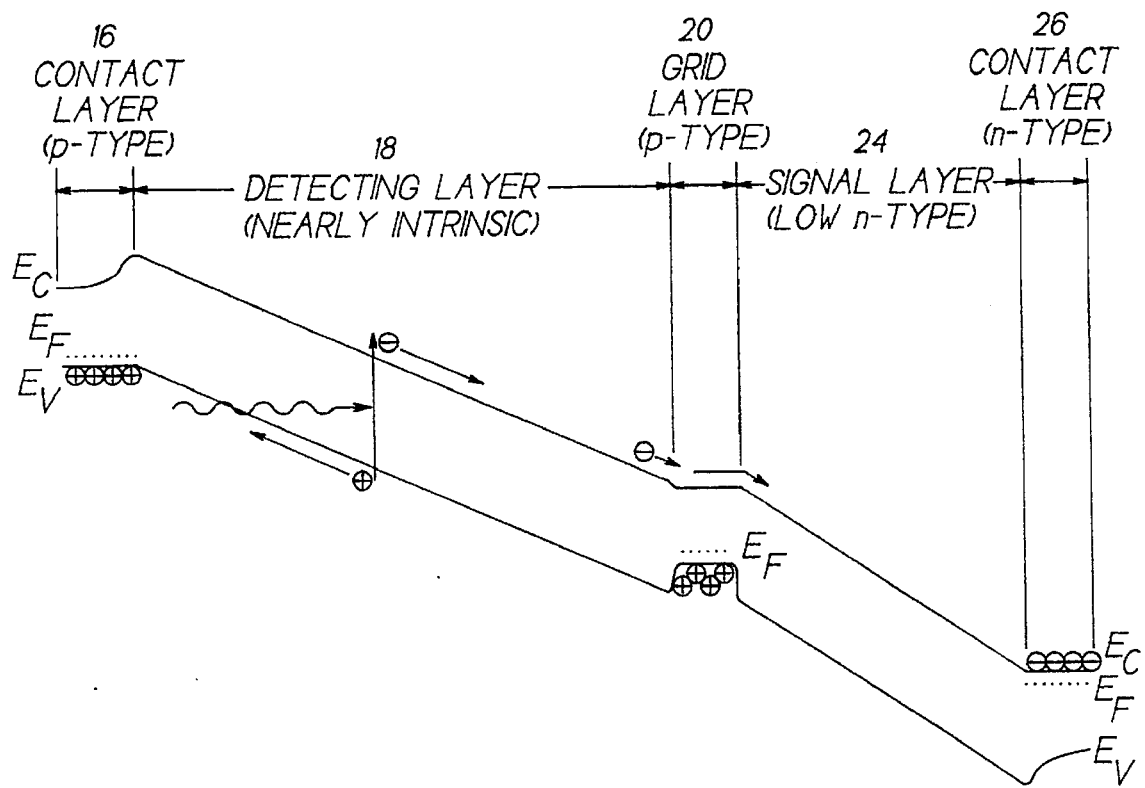
FIG. 3 is an energy band diagram that illustrates semiconductor energy band profiles, relative to various layers of semiconductor material, in the solid-state ionizing radiation detector of this invention.
Figure 4:
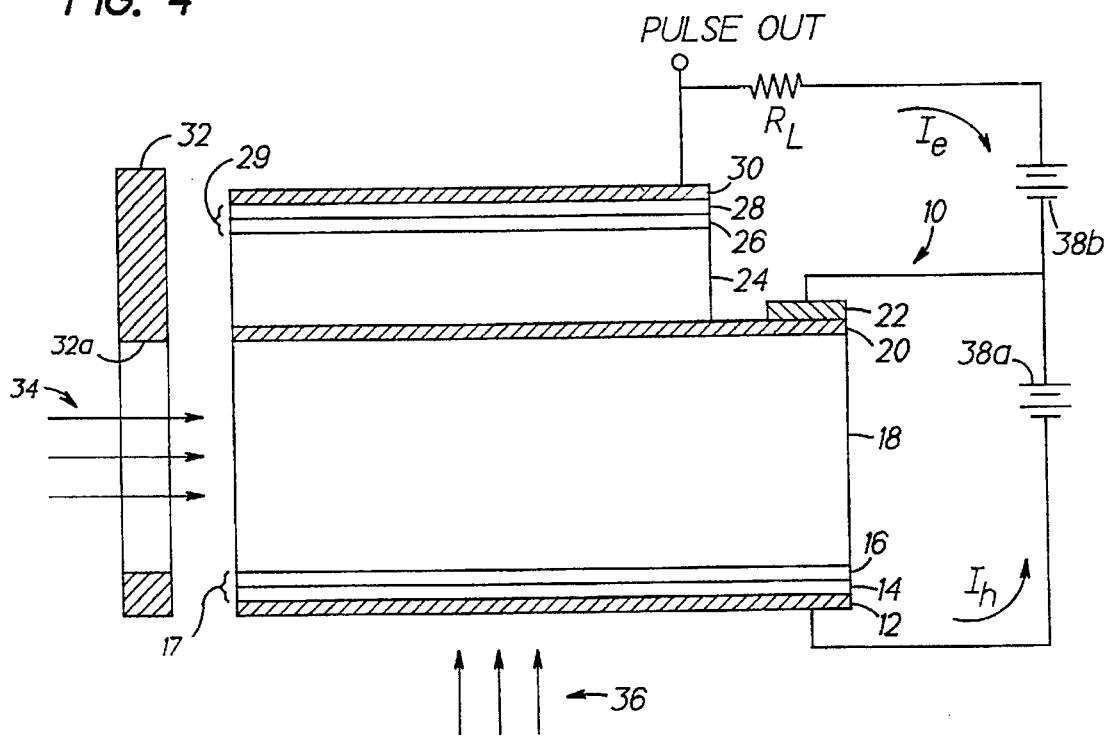
FIG. 4 is an enlarged cross-sectional view, not to scale, of an embodiment of a solid-state ionizing radiation detector in accordance with the teaching of this invention.

FIG. 3 is a diagram of the semiconductor energy band profiles, with appropriate operating voltages applied, for the solid-state ionizing radiation detector 10 that is depicted in cross-section in FIG. 4. In FIG. 3 $E_c$ and $E_v$ represent the conduction band edge and valence band edge, respectively. $E_F$ represents the Fermi level, and is shown only in those regions where the electric field is at or near zero.

Referring to FIG. 4, the various layers of metalization and semiconductor material are as follows. A metal cathode contact 12 underlies a first p-type HgCdTe contact layer 14 and a second p-type HgCdTe contact layer 16 which together comprise a composite contact layer 17 of compositionally graded, p-type $Hg_{(1-x)}Cd_xTe$ having a thickness of approximately 10 µm. By example, in the layer 14 the value of x is equal to 0.2, while in the layer 16 the value of x may vary between approximately 0.8 to approximately 1.0. Reference may also be had to the above referenced commonly assigned U.S. Pat. No. 5,391,882 for a description of a presently preferred compositionally graded contact layer system.

Overlying the composite contact layer 17 is the ionizing radiation detecting layer 18. In a presently preferred embodiment of this invention the detecting layer 18 is comprised of intrinsic or nearly intrinsic $Cd_{1-y}Zn_yTe$, and has a thickness, typically, of 1000 µm. In the detecting layer 18 the value of y is equal, preferably, to approximately 0.04 to approximately 0.2 and is undoped (intrinsic) or very lightly doped of either conductivity type. Overlying the detecting layer 18 is a "grid" layer 20, which, although referred to herein as a grid, is in this embodiment preferably a continuous thin layer of compound semiconductor material having a thickness in a range of, by example, 0.1 µm to 5 µm, with 1 µm being a presently preferred thickness. The grid layer 20 is comprised of, by example p-type $Hg_{1-x}Cd_xTe$ (e.g., $10^{17}$ dopant atoms per cubic centimeter), wherein x has a value in the range of approximately 0.5 to approximately 0.9. A metallic contact 22 is coupled to the grid layer 20 for coupling the grid layer to a source of grid bias.

Overlying the grid layer 20 is a lightly doped drift or signal layer 24 comprised of n-type CdTe or CdZnTe. The thickness of the signal layer 24 is preferably in the range of 10 µm to 100 µm, thereby making the signal layer 24 significantly thinner (for example, at least an order of magnitude thinner) than the detecting layer 18. Overlying the signal layer 24 is a first n-type HgCdTe contact layer 26 and a second n-type HgCdTe contact layer 28 which together comprise a composite contact layer 29 of compositionally graded, n-type $Hg_{(1-x)}Cd_xTe$ having a thickness of approximately 10 µm. By example, in the layer 26 the value of x may vary from approximately 0.8 to approximately 0.9, while in the layer 28 the value of x is equal to approximately 0.2. Reference may again be had to the above referenced commonly assigned U.S. Pat. No. 5,391,882 for a description of the presently preferred compositionally graded contact layer system. A metal contact 30 (e.g., a layer of Au) functions as the anode electrode and is maintained, during use, at a positive potential with respect to the cathode contact 12. The potential difference between the cathode contact 12 and the anode contact 30 establishes an electric field across the detector 10 in a direction that is generally orthogonal to the grid layer 20. More particularly, a first bias source, shown schematically as a battery 38a, is connected between the cathode contact 12 and the grid contact 22, while a second, independent bias source, shown schematically as a battery 38b, is connected between the grid contact 22 and the anode contact 30.

It should be noted that the device is planar (ignoring the portion reserved for the grid contact 22) and, as a result, the electric field across the device 10 is generally uniform. It should further be noted that the electric field strength between the cathode/grid may be different than the electric field strength between the grid/anode electric field.

It is within the scope of the teaching of this invention to replace the contact layers 17 and 29 with metal film contacts that form Schottky barriers of a polarity that blocks or impedes the injection of carriers into the adjoining semiconductor material.

It can readily be seen that the detector 10 is a three-terminal device, wherein an external readout circuit (not shown) is connected to the two contact electrodes 12 and 30, as well as to the grid layer contact 22. During operation the cathode contact 12 is maintained, preferably, at several hundreds of volts negative with respect to the grid contact 22, and the anode contact 30 is maintained at a potential that is positive with respect to the grid contact 22.

Figure 5A:
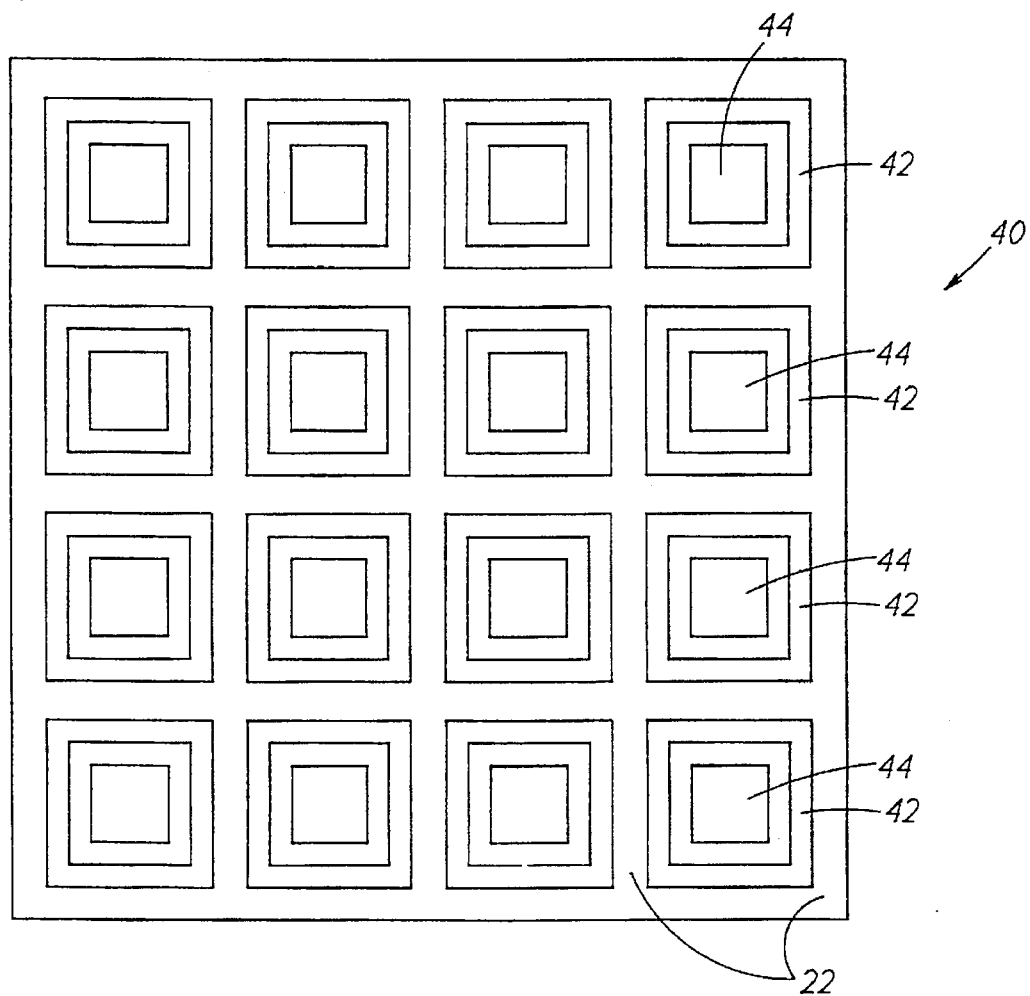
FIG. 5A is an enlarged plan view and FIG. 5B a side view, not to scale, of an array of ionizing radiation detectors in accordance with this invention.
Figure 5B:
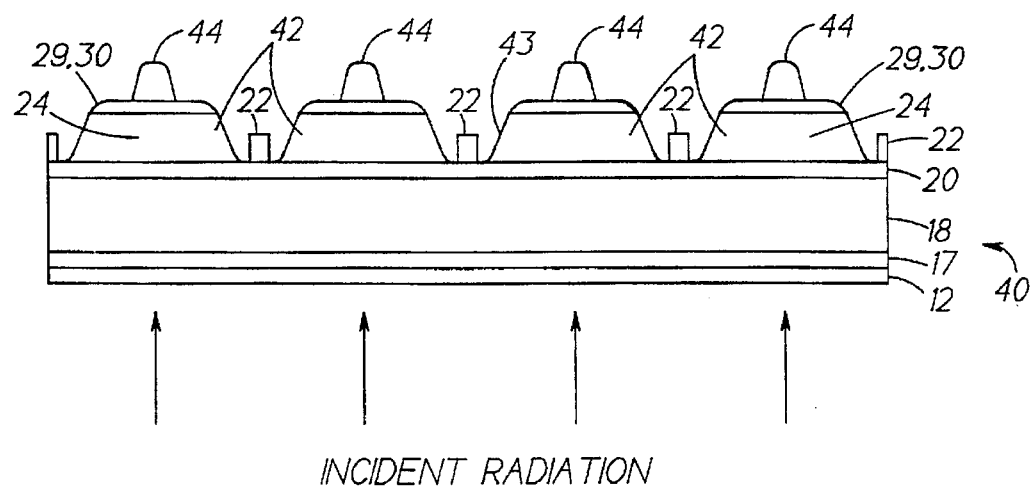

Although not forming a part of the detector 10 per se, during use a collimator 32, having an aperture 32a, can be positioned for admitting incident high energy ionizing radiation 34 to the detecting layer 18. Alternately, radiation having energies greater than about 10 keV may penetrate the relatively thin cathode region comprised of layers 12, 14 and 16 to enter the detecting layer 18. This latter mode of operation is preferred when constructing area arrays of detectors, as depicted in FIGS. 5A and 5B.

The functions of the various above-described layers are now described. Within the detecting layer 18, incident ionizing radiation is absorbed and the electron-hole pairs are generated, as shown in FIG. 3. The holes drift in the electric field established across the detector 10 by a voltage source shown schematically as the batteries 38a and 38b. The holes drift toward the p-type contact layer 17 which is biased negatively with respect to the grid layer 20. The electrons instead drift toward the grid layer 20. The electrons diffuse across and through the p-type grid layer 20, within which they are minority carriers, and subsequently drift again within the electric field through the signal layer 24 until they reach the n-type contact layer 29, which is positive with respect to the grid layer 20.

As is evident in FIG. 4, because of the presence of the grid layer 20 a first current due to the faster electrons ($I_e$) flows in a first circuit that includes a load resistance $R_L$. The pulse generated across the load resistance by $I_e$ is the output signal (Pulse Out). A second current due to the slower holes ($I_h$), and also the electrons before they reach the grid 20, flows through a second circuit. In this manner the effect of the hole current is removed from Pulse Out by being confined to the grid/cathode circuit, which is the desired result.

At this point in the description a partial analogy to a bipolar junction transistor can be made. That is, the grid layer 20 may be viewed as being analogous to the base of the transistor, and the signal layer 24 may be viewed as being analogous to the depletion region of the reverse-biased base-collector junction of the transistor. However, in a transistor the minority carriers are injected into the base by means of a forward-biased emitter-base junction, whereas in the detector 10 of this invention the minority carriers are injected from the detecting layer 18. A significant point of this analogy is that injected carriers can diffuse across a narrow region (i.e., the grid layer 20), in which they are minority carriers, and then be swept up by an electric field on the other side of the narrow region.

For the illustrated embodiment it is important that the grid layer 20 be p-type semiconductor material, so that the electrons will be minority carriers within the grid layer. In addition, the grid layer 18 should be sufficiently thin so that the electrons can diffuse across it with negligible recombination. In this regard the diffusion length $L_{dif}$ of electrons in HgCdTe at room temperature can be estimated conservatively by assuming a recombination lifetime of $10^{-7}$ sec and a mobility of 1000 $cm^2$ $V^{-1}$ $sec^{-1}$. In accordance with the relationship wherein $L_{dif}$ is equal to the square root of $(kT\mu_e\tau_e)/q$, where k is Boltzmann's constant, T is temperature, $\mu_e$ is electron mobility, $\tau_e$ is the electron lifetime, and q is the charge of the electron, this yields a value for $L_{dif}$ of approximately 16 µm. So long as the grid layer 20 is thin compared to $L_{dif}$, the electrons can pass through it without experiencing significant losses.

It is further noted that the grid layer 20 should have sufficient conductivity so that any leakage currents flowing in or out of the grid layer 20 do not produce a potential difference in the plane of the grid layer. By example, and assuming a leakage current of 1 nA, which is a typical value for a CdZnTe p-i-n gamma ray detector, and further permitting a maximum of only 1 mV deviation from a uniform potential throughout the grid layer 20, the sheet resistance is preferably less than $10^6$ Ω. Assuming a thickness of the grid layer 20 of 1 µm, this value of sheet resistance can easily be achieved with a p-type doping level of $10^{15}$ $cm^{-3}$ or more.

It is also noted that the bandgap of the grid layer 20 should be smaller than the bandgap of the detecting layer 18, so that there will be a barrier in the valence band at the interface between these two layers, as shown in FIG. 3. This bandgap differential-induced barrier functions to prevent the majority carriers (i.e., holes) from being injected into the detecting layer 18 and causing leakage and noise. On the other hand, there should be little or no barrier in the conduction band at the interface between the grid layer 20 and the signal layer 24, as the presence of such a barrier would impede the flow of electrons. The absence of a barrier to electrons can be insured by lightly doping the signal layer 24 to be n-type.

Finally, it should be noted that attention must be paid to the thicknesses of the detecting layer 18 and the signal layer 24. The thickness of the detecting layer 18 may range from 100 µm to at least 10,000 µm (1 cm), with typical values being in the range of 1000 µm to 2000 µm. The thickness of the detecting layer 18 is determined by the absorption length of typical gamma rays in the CdZnTe semiconductor material that comprises the detecting layer 18. The ionizing radiation may enter the detector 10 through the p-type contact layer 17, or through the side as illustrated for the incident radiation 34 in FIG. 4, or for high energy sources (e.g.,>500 keV), through the anode contact 30. In this latter configuration the radiation passes through the signal layer 24 and grid layer 20, and is absorbed in a relatively thick detecting layer 18. In any of these various configurations some ionizing radiation may reach and/or be absorbed in the signal layer 24, which is undesirable. However, the absorption of ionizing radiation in the signal layer 24 can be minimized by making the signal layer 24 relatively thin, such as in the range of 10 µm to 100 µm.

Although FIG. 4 illustrates a single detector, one and two dimensional arrays of detectors can also be fabricated, as illustrated in FIGS. 5A and 5B, on a single wafer or substrate of, by example, high quality CdZnTe. The various contact, grid and signal layers are grown by one or a combination of suitable growth processes, such as Molecular Beam Epitaxy (MBE), Vapor Phase Epitaxy (VPE), Metal-Organic Chemical Vapor Deposition (MOCVD) or Liquid Phase Epitaxy (LPE), upon and over the CdZnTe substrate. MBE is a presently preferred growth technique in that it is capable of forming thin, high quality layers of semiconductor material. However, and by example, it is within the scope of the invention to grow the grid layer 20 by LPE, and to then thin the grid layer to the desired thickness before growing the signal layer 24.

FIGS. 5A and 5B illustrate a two dimensional array 40 of ionizing radiation detectors or pixels 10. In this embodiment the CdZnTe material of the detecting layer 18 is common to all of the detectors, while the signal layer 24 and the overlying contact layer 29 is differentiated into a plurality of mesa structures 42, such as by one or more of reactive ion etching, ion milling, or wet chemical etching. Alternatively, the mesa structures 42 can be grown by patterned deposition techniques. Each mesa structure 42 includes an electrical interconnect, such as a conventional In bump 44, for interfacing and hybridizing the individual ionizing radiation detectors of the array 40 to an external readout integrated circuit (not shown). Reference in this regard may be had to U.S. Pat. No. : 5,379,336, "Hybridized Semiconductor Pixel Detector Arrays for use in Digital Radiography", by G. Kramer et al.

In the embodiment of FIGS. 5A and 5B the grid metalization 22 and cathode metalization 12 is coupled in common to all of the detectors, with the grid metalization 22 running between the mesa structures 42 for contacting the underlying grid layer 20. Alternatively, the grid metalization 22 could contact the grid layer 20 only at the edge of the array and/or at a few locations within the array.

When viewing FIGS. 5A and 5B it should be realized that the surfaces of the mesa structures 42 may be passivated with a layer 43 comprised of a dielectric material (e.g., an oxide) or a relatively wide-bandgap semiconductor material. As such, the grid metalization 22 is formed over the passivation layer 43, and contacts the grid layer 20 through suitably formed apertures within the passivation layer.

In this embodiment the incident ionizing radiation can be introduced through the cathode metalization 12, as was described above.

The individual detector or pixel size for the array 40 is a function of the expected energy of the ionizing radiation for an intended application and the lateral spread of the primary photoelectrons. By example only, for a nuclear medicine application wherein the ionizing radiation has an energy of about 140 keV, a 375 µm pitch (center-to-center spacing) may be suitable for the individual detectors, whereas for a lower energy diagnostic x-ray application the detector pitch may be significantly less.

It should be noted that although the above-disclosed embodiments of the invention employ a layer of semiconductor material (i.e., a layer of HgCdTe) as the grid layer 20, it is within the scope of this invention to form the grid layer 20 in a different manner. By example, in one embodiment the grid layer 20 can be formed as a result of a patterned ion implantation operation or by ion beam writing. In this case a first relatively thin portion of the n-type signal layer 24 can be deposited by, for example, MBE. Next, the structure is transferred from the vacuum of the MBE growth chamber to the vacuum of an ion implant chamber, and an apertured pattern (e.g., an array of orthogonally disposed lines) of a suitable p-type dopant, such as As, is implanted into the first portion of the n-type signal layer 24. The resulting patterned-doped region forms the grid layer 20. The structure is then transferred back to the MBE growth chamber to complete the growth of the signal layer 24 to the desired thickness. It is noted that it is not necessary to remove the structure from vacuum during the transfer operations.

It is also within the scope of this invention to introduce the dopant species from a patterned solid source by a thermal diffusion process.

It is also within the scope of this invention to form an apertured electrically conductive pattern by sputtering or evaporating a suitable electrical conductor, such as a metal, upon the surface of the detecting layer 18 and before the growth of the overlying signal layer 24. In this case the electrically conductive grid pattern functions as the grid layer 20.

In both of the last two embodiments the electrons drift through the openings in the grid pattern, as opposed to drifting through the continuous semiconductor layer as described with respect to FIGS. 3 and 4.

Thus, while the invention has been particularly shown and described with respect to preferred embodiments thereof, it will be understood by those skilled in the art that changes in form and details may be made therein without departing from the scope and spirit of the invention.

What is claimed is:

1. An ionizing radiation detector, comprising:
    a first layer comprised of semiconductor material, said first layer being responsive to incident ionizing radiation for generating electron-hole pairs;
    a second layer comprised of semiconductor material;
    electrode means interposed between a first surface of said first layer and a first surface of said second layer; and
    means for establishing an electric field across said first layer and said second layer such that holes move away from said electrode means and electrons move towards and through said electrode means, through said second layer, and generate a detectable output signal.

2. An ionizing radiation detector as set forth in claim 1, wherein said electrode means is comprised of a third layer of semiconductor material having a conductivity type such that electrons are a minority charge carrier within said third layer.

3. An ionizing radiation detector as set forth in claim 2, wherein said third layer has a thickness such that substantially all injected electrons pass through said third layer and into and through said second layer.

4. An ionizing radiation detector as set forth in claim 1, wherein said electrode means is comprised of a third layer of semiconductor material having an energy bandgap wherein an interface between said third layer and said first layer functions as a barrier to holes.

5. An ionizing radiation detector as set forth in claim 1, wherein said electric field establishing means is comprised of a first contact region adjacent to a second surface of said first layer, a second contact region adjacent to a second surface of said second layer, wherein said first contact region is biased negatively with respect to said electrode means, and wherein said second contact means is biased positively with respect to said electrode means.

6. An ionizing radiation detector as set forth in claim 1, wherein said electrode means is comprised of a third layer of semiconductor material, wherein a bandgap energy of said third layer is less than a bandgap energy of said first layer at an interface between said first layer and said third layer, and wherein the bandgap energy of said third layer is less than or approximately equal to a bandgap energy of said second layer at an interface between said second layer and said third layer.

7. An ionizing radiation detector as set forth in claim 1, wherein a thickness of said first layer is at least about an order of magnitude greater than a thickness of said second layer.

8. An ionizing radiation detector as set forth in claim 1, wherein said first layer, said second layer, and said electrode means are each comprised of a Group II–VI alloy semiconductor material.

9. An ionizing radiation detector as set forth in claim 1, wherein said first layer is comprised of substantially intrinsic CdZnTe.

10. An ionizing radiation detector as set forth in claim 1, wherein said second layer is comprised of one of CdZnTe and CdTe.

11. An ionizing radiation detector as set forth in claim 1, wherein said electrode means is comprised of a substantially continuous layer of p-type $Hg_{(1-x)}Cd_xTe$, wherein x has a value in a range of approximately 0.5 to approximately 0.9.

12. An ionizing radiation detector as set forth in claim 1, wherein said first layer and said second layer are each comprised of a Group II–VI alloy semiconductor material, and wherein said electrode means is comprised of a region that contains a dopant disposed in an apertured pattern.

13. An ionizing radiation detector as set forth in claim 1, wherein said first layer and said second layer are each comprised of a Group II–VI alloy semiconductor material, and wherein said electrode means is comprised of a region that contains an electrical conductor disposed in an apertured pattern.

14. An ionizing radiation detector as set forth in claim 1, wherein there are a plurality of said ionizing radiation detectors each of which is comprised of a portion of a common first layer and an individual second layer.

15. A method for operating an ionizing radiation detector, comprising the steps of:
    absorbing ionizing radiation and generating electron-hole pairs in a first layer comprised of semiconductor material, the first layer being separated from a second layer, also comprised of semiconductor material, by an electrode that is interposed between a first surface of the first layer and a first surface of the second layer; and
    establishing an electric field across the first layer and the second layer such that holes drift away from the electrode and electrons drift towards and through the electrode, through the second layer, and generate a detectable output signal, wherein a contribution of holes to the detectable output signal is minimized.

16. A three terminal solid-state ionizing radiation detector, comprising:
    a first layer comprised of a substantially intrinsic Group II–VI compound semiconductor material, said first layer being responsive to incident ionizing radiation for generating electron-hole pairs;
    a second layer comprised of Group II–VI compound semiconductor material;
    a third layer comprised of Group II–VI compound semiconductor material that is interposed between a first surface of said first layer and a first surface of said second layer;

first electrical contact means coupled to a second surface of said first layer, second electrical contact means coupled to a second surface of said second layer, and third electrical contact means coupled to said third layer, said first, second and third contact means for coupling said detector to an external circuit that establishes an electric field across said detector such that holes drift away from said third layer towards said first contact means, and electrons drift towards and through said third layer, through said second layer and towards said second contact means for generating a detectable output signal;

wherein said third layer has a conductivity type such that electrons are a minority charge carrier within said third layer and an energy bandgap such that an interface between said third layer and said first layer functions as a barrier to holes.

17. A three terminal solid-state ionizing radiation detector as set forth in claim 16, wherein said first contact means is biased negatively with respect to said third contact means, and wherein said third contact means is biased negatively with respect to said second contact means.

18. A three terminal solid-state ionizing radiation detector as set forth in claim 16, wherein said first layer is comprised of CdZnTe, wherein said second layer is comprised of a Cd compound, and wherein said third layer is comprised of a substantially continuous layer comprised of p-type $Hg_{(1-x)}Cd_xTe$, wherein x has a value in a range of approximately 0.5 to approximately 0.9.

19. A three terminal solid-state ionizing radiation detector as set forth in claim 16, wherein there are a plurality of said radiation detectors each of which is comprised of a portion of a common first layer and an individual second layer.

20. An array of ionizing radiation detectors, comprising:

a first layer comprised of semiconductor material, said first layer being responsive to incident ionizing radiation for generating electron-hole pairs;

a second layer comprised of semiconductor material;

an electrode region interposed between a first surface of said first layer and a first surface of said second layer;

first electrical contact means coupled to a second surface of said first layer, second electrical contact means coupled to a second surface of said second layer, and third electrical contact means coupled to said electrode region for connecting to an external circuit that establishes an electric field across the layers such that holes drift away from said electrode region towards said first contact means, and electrons drift towards and through said electrode region, through said second layer and towards said second contact means for generating a detectable output signal;

wherein said second layer and said second electrical contact means are differentiated into a plurality of separate second layer portions and corresponding second electrical contact means portions each of which forms, in combination with an underlying portion of said electrode region and an underlying portion of said first layer, an ionizing radiation detector pixel.

21. A method for fabricating an array of ionizing radiation detectors, comprising the steps of:

providing a first layer comprised of semiconductor material, the first layer being responsive to incident ionizing radiation for generating electron-hole pairs;

forming an electrode region upon a first surface of the first layer;

growing, upon the electrode region, a second layer comprised of semiconductor material;

forming first electrical contact means upon a second surface of the first layer, second electrical contact means upon a second surface of the second layer, and third electrical contact means that is coupled to the electrode region for connecting to an external circuit that establishes an electric field across the layers; and differentiating the second layer and the second electrical contact means into a plurality of separate second layer portions and corresponding second electrical contact means portions each of which forms, in combination with an underlying portion of the electrode region and an underlying portion of the first layer, an ionizing radiation detector pixel.

\* \* \* \* \*